United States Patent
Wang

(10) Patent No.: US 8,153,510 B2
(45) Date of Patent: Apr. 10, 2012

(54) SEMICONDUCTOR BOND PAD PATTERNS AND METHOD OF FORMATION

(75) Inventor: James Jen-Ho Wang, Phoenix, AZ (US)

(73) Assignee: Power Gold LLC, Phoenix, AZ (US)

( * ) Notice: Subject to any disclaimer, the term of this patent is extended or adjusted under 35 U.S.C. 154(b) by 126 days.

(21) Appl. No.: 12/799,444

(22) Filed: Apr. 26, 2010

(65) Prior Publication Data

US 2010/0279489 A1    Nov. 4, 2010

Related U.S. Application Data

(60) Provisional application No. 61/215,038, filed on May 1, 2009.

(51) Int. Cl.
*H01L 21/00* (2006.01)
(52) U.S. Cl. ........ 438/460; 438/595; 438/612; 438/687; 257/E21.59; 257/E21.599
(58) Field of Classification Search .................. 438/460, 438/595, 612, 687; 257/741, 750, 757, E21.59, 257/E21.599; 216/13
See application file for complete search history.

(56) References Cited

U.S. PATENT DOCUMENTS

| 4,514,265 | A | 4/1985 | Rao et al. |
| 6,646,347 | B2* | 11/2003 | Mercado et al. ............. 257/751 |
| 6,888,246 | B2 | 5/2005 | Mercado et al. |
| 7,307,346 | B2 | 12/2007 | Kaltalioglu et al. |
| 7,521,812 | B2 | 4/2009 | Lee et al. |
| 8,004,092 | B2* | 8/2011 | Lin et al. ....................... 257/781 |
| 2009/0124073 | A1* | 5/2009 | Liu et al. ....................... 438/612 |

* cited by examiner

*Primary Examiner* — Charles Garber
*Assistant Examiner* — Abdulfattah Mustapha
(74) *Attorney, Agent, or Firm* — Edward James Mischell

(57) ABSTRACT

In a semiconductor wafer, the polyimide film underneath a power metal structure is partially etched to create corresponding surface depressions of the conformal top power metal. The depressions at the surface of power metal are visible under optical microscopy. Arrangement of the depressions in a pattern facilitates the alignment of probe needles, set-up of automated wire bonding and microscopic inspection for precise alignment of wire bonds.

17 Claims, 3 Drawing Sheets

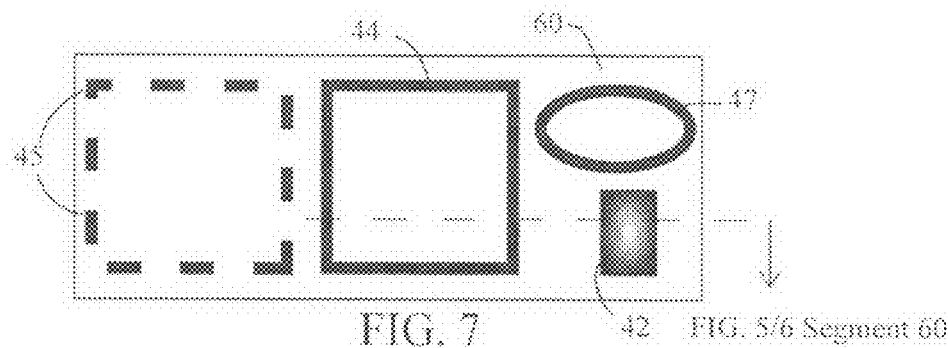
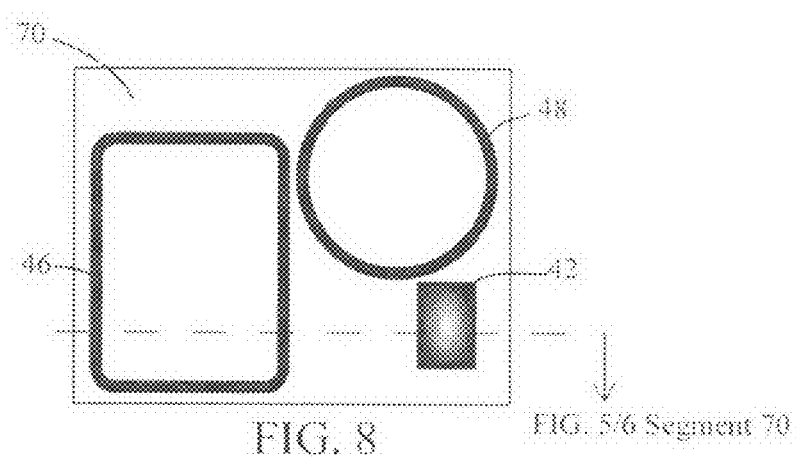
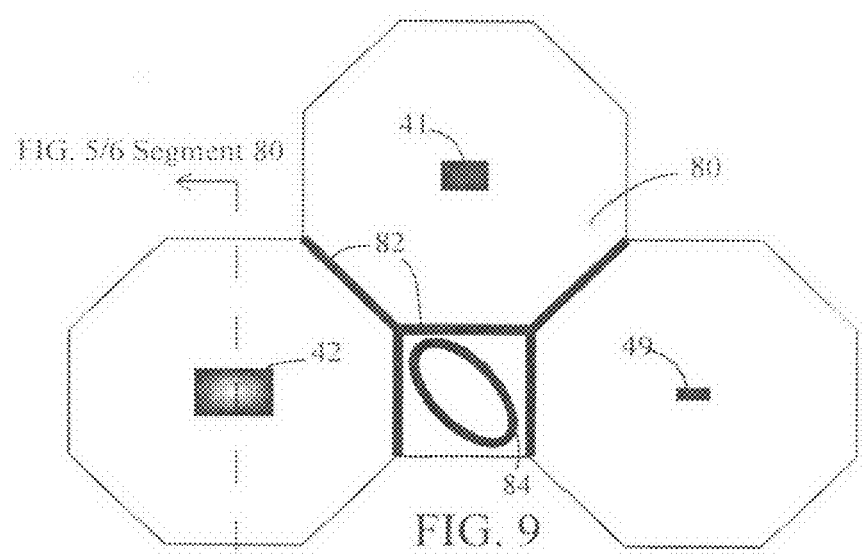

SEMICONDUCTOR BOND PAD PATTERNS AND METHOD OF FORMATION

The following patent application is based upon and claims priority from provisional patent application number U.S. 61/215,038 filed May 1, 2009.

BACKGROUND OF THE INVENTION

The present invention relates to semiconductor manufacturing and more particularly to the identification of probe areas and bond pad areas on semiconductor devices and wafers.

Many methods are used to create pad metal on the surface of semiconductor devices. A common pad metal is sputter deposited TiN/Al films that is patterned and etched to define the final metal bond pads. Aluminum pad metal is then covered with oxide/nitride passivation. This passivation film is patterned and again selectively etched to define openings through the passivation to expose aluminum metal pads for probing and for wire bonding. Both wire bond locations and the probe sites are defined by a shiny metal surface outlined by openings through surface passivation. Openings to aluminum pads are microscopically visible and used by inspectors and automated vision system to verify the precise placement of probe needles and wire bonds within the confines of the passivation openings.

Thicker pad metals are suited for wire bonding directly over active circuits to avoid damaging fragile devices and to lower metal resistance for power integrated circuits. As pad metal thickens over 1 micron to become power metal, thicker metal is more difficult to cover with a thick passivation film. Therefore, power metals are typically unpassivated and do not have passivation openings to outline the areas where pads are to be probed for testing and where bond wires should be placed on the pads for circuit and component assembly.

Therefore, what is needed is a method of providing visual features for probe and bond pad areas for unpassivated, power metal pads to aid human operators and automated vision systems to quickly locate and inspect for alignment of probes and wire bonds.

In the present state of the art, thick electroplated power metals exhibit high residual film stresses and a polyimide or organic stress buffer layer between the power metal and the brittle underlying passivation. The organic buffer layer planarizes the chip surface such that conformal power metal is also planar on top of polyimide.

Wire bonds are placed so as to avoid bonding onto power metal pad areas where there is no polyimide stress buffer protection and over fragile active devices.

FIG. 1 shows cross-sectional view of a semiconductor device of the present art. To simplify the drawing, active and passive components, for example, transistors, diodes, capacitors, resistors and multiple layers of interconnect metal and interlayer dielectric layers in semiconductor substrate 1 are not drawn under metal lines 22 and pad metals 24, 25 and 26. Passivation 5 covers metal lines 22, and pad metals 24, 25 and 26. Metal lines and pad metal commonly deposited is TiN/Al Passivation is typically plasma oxide/nitride film. Both pad metals and passivation are patterned with photoresist and dry etched to create metal lines 22, metal pads 24, 25 and 26 and to create passivation openings 12.

FIG. 2 shows the addition of intermediate polyimide layer 30. The composition of intermediate layer 30 is alternatively benzocyclobutene (BCB) or another high temperature organic material. Intermediate layer 30 resides over passivation layer 5. Three openings 32 through intermediate polyimide layer 30 are shown directly over three passivation openings 12. Intermediate polyimide layer 30 is spin coated as a liquid. When photo-sensitive polyimide is used, it is UV exposed and polyimide openings 12 developed similar to photoresist. Polyimide is then bake cured. Its surface is planar except at openings 32. Depending upon the type of polyimide used, there is minimum opening size where consistent electrical contacts through both openings 32 and 12 to metal pads 24 and 26 are achieved. Larger opening sizes are not shown to simplify drawings. Opening size smaller than minimum design rules is design violation and not allowed.

FIG. 3 shows the resultant of deposition, electroplating and etch of power metal 40 over intermediate polyimide layer 30. Note that three opening dimples 42 on surface of power metal layer 40 conform over three polyimide openings 32 in polyimide 30. Dimples 42 are created as a result of completely etching through the polyimide. Dimples 42 are used for contacting subsurface components. These three dimples appear under optical microscopy. A gold ball bond 50 is thermal compression bonded onto surface of power metal 40. Dimples 42 are electrical contact points between power metal 40 and pad metals 24 and 26. The gold electroplating on wafers consists of the process of seed metals sputter, followed with photoresist patterning, gold electroplating, resist strip and then seed metal strip.

BRIEF DESCRIPTION OF THE DRAWINGS

FIG. 7 illustrates top view of power metal pad with two square dimple patterns to signify bond site plus oval pattern for probe site.

FIG. 8 illustrates top view of another power metal pad showing circular and rectangular dimple patterns.

FIG. 9 illustrates top view of merged octagonal power metal pads with locator dimples to pinpoint center points, pad perimeters and the probe site.

SUMMARY OF THE INVENTION

Accordingly it is the object of the present invention to provide visible patterns on a power metal surface of a semiconductor wafer to provide locators to accommodate manual and automated vision systems for probing, setting up tools to bond wires, and for inspecting whether probes and wire bonds are accurately placed within assigned positions on pads, and for estimating wire bond parameters.

It is an object of the invention to utilize polyimide mask patterns for processing contact openings concurrently with pad locators, without incurring added processing costs.

Polyimide patterns, configured with smaller mask dimensions, create lesser depressions in polyimide as compared to wide, completely etched-through through polyimide openings. The smaller depressions are distinguishable as dimples on power metal surfaces and provide designers with the ability to layout smaller pad patterns at close proximity and directly under bond pads and to define precise bond locations.

Different shapes and pattern sizes of locator dimples allow IC designers to define precise locations to probe power metal pads, locations of primary ball bonds and locations of secondary wedge bonds. Circular, square, rectangular, oval shapes facilitate easier and quicker inspection with less confusion and error. Visible marks are possible to designate pad 1 location and to define engineering probe sites.

Dimples, smaller than a wire diameter, are placed at the centers of secondary bonds where mechanical stress from capillary tool tip is low. Exact placement of a dimple mark at the center of an octagonal pad further distinguishes secondary wedge bond sites from primary ball bond sites.

DETAILED DESCRIPTION OF THE DRAWINGS

Plasma oxide/nitride and PECVD silicon oxide are common semiconductor passivation films. Final dielectric of polyimide, benzocyclobutene or other high temperature organic film is deployed over passivation. Power metal is composed of or is a combination of 1 to 25 microns of electroplated copper, Ni/Au, gold, silver or Ni/Pd on top of an adhesion layer such as TiN, TiW, TiWN, TaN or NiCr. The present invention contemplates a method and structure for creating depressions in the final dielectric and correspondingly visible dimples on the surface of over passivation metal called power metal. Polyimide is selected as best mode in embodiments, those skilled in art know that other high temperature films when deployed also form depressions and dimpled patterns.

Many steps are required, such as photolithography, exposure, develop, seed metal deposition, etches, bake, etc. to form a complete semiconductor flow and method. These steps are known to skilled artisans and therefore are not mentioned in order to reduce the number of steps plus to simplify descriptions and drawings. Embodiments of the present invention are now more fully discussed in reference to accompanying figures.

All figures are not drawn to scale.

Figure 1:
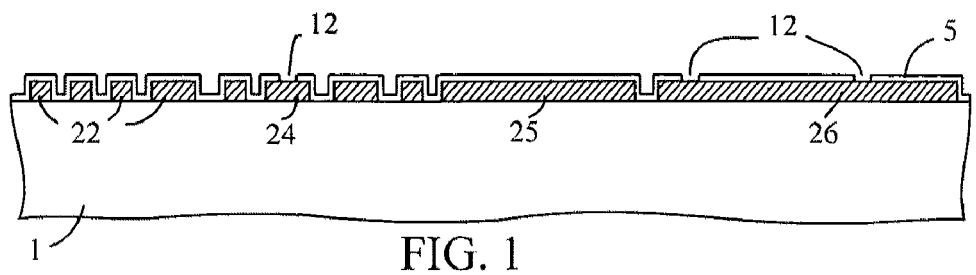
FIG. 1 illustrates a cross-section of a present state of the art semiconductor wafer.
Figure 2:
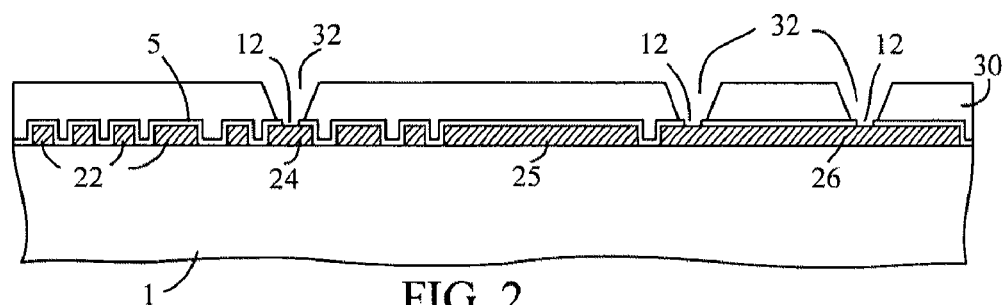
FIG. 2 illustrates a cross-section of the semiconductor wafer of FIG. 1, having a polyimide layer over passivation.
Figure 3:
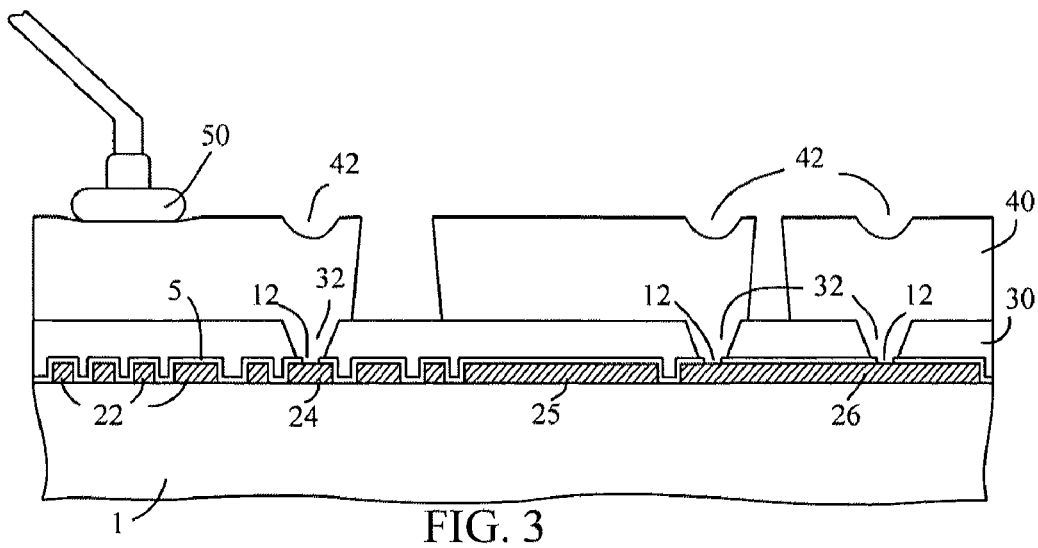
FIG. 3 illustrates a cross-section of the semiconductor wafer of FIG. 2 with power metal plus a ball bond over a polyimide layer.
Figure 4:
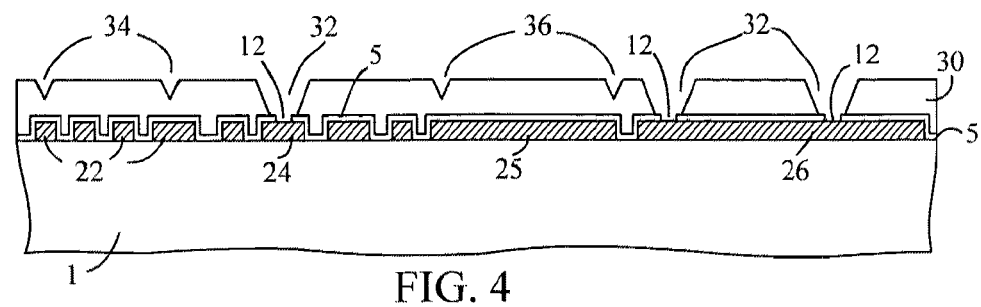
FIG. 4 illustrates a cross-section of a semiconductor wafer with depressions in a polyimide layer that are formed at same time as larger polyimide openings.

Looking at FIG. 4 a cross-sectional view of a portion of a semiconductor wafer of the present invention is shown.

Substrate 1 is suitable for configuring integrated components, both active and passive. To provide clarity, the integrated components are not shown. The integrated components are, but are not limited to transistors, diodes, capacitors, resistors, and inductors. The integrated components are in situ, or alternatively surface mounted. Substrate 1 is, but not limited to, silicon, germanium, SiGe, GaAs, glass, ceramic, fiberglass, flexible organic substrates, and printed circuit board materials.

Metal lines 22, metal pad 24, large metal pad 25, and multiple vias pad 26 reside directly or indirectly on the surface of substrate 1. The metal lines, metal pad, large metal pad, and multiple vias pad are used for interconnect and for surface contacts, and are protected with passivation layer 5, except in areas of polyimide openings 32. Metal lines and pads are, but are not limited to, aluminum, copper, silver, Ti, TiW, gold, Ni, alloys, TiN, and stacked metal layers. Passivation 5 is, but is not limited to, oxide/nitride, silicon oxide, silicon nitride, no passivation layer, and titanium oxide.

Polyimide openings 32 are used to provide ohmic contact pathways to underlying layers, not shown. Additional depressions 34 and 36, in intermediate polyimide layer 30, are patterned at the same time as polyimide openings 32, using the same photomask level for patterning. Alternatively, images for polyimide openings and polyimide depressions are placed on separate photomasks. Small depressions 34 and 36 are formed purposely by designing widths of the polyimide layer 30 photo-mask narrower than the minimum design requirement to achieve consistent openings through the polyimide layer. For one type of photo-imageable polyimide having thickness of 2.5 microns, minimum photo-mask width of 8 microns and wider are required to completely develop out the polyimide openings 32. By purposely designing and processing narrower widths at 6 microns and below along with 8 microns and wider feature sizes to pattern this photo-sensitive polyimide layer 30, two types of features are created on the wafer. After UV expose and develop, for mask features having the required minimum and greater dimensions, polyimide layer 30 forms contact vias and polyimide openings 32. On the same wafer, with 6 microns down to 2 microns mask features, below the minimum design rule, polyimide layer 30 does not consistently develop out. Therefore, the polyimide may or may not completely etch through, leaving partial openings, i.e., depressions, into the polyimide.

Those skilled in art realize that many types of polyimides and organic films are available. Alternatively, polyimide layer 30 is, but is not limited to, polyimide, BCB, high temperature organic compounds, and doped oxide. Each film type, thickness has different minimum design rules. Organic dielectric film thickness can be from 1.5 microns up to 20 microns after cure. Therefore, the mask design to create both depressions plus openings changes with each film type and wafer fabrication method.

Figure 5:
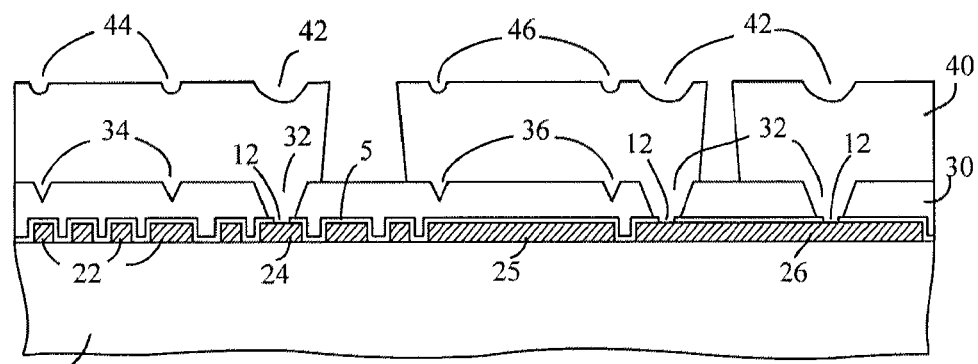
FIG. 5 illustrates a cross-section of the semiconductor wafer of FIG. 4 with power metal with dimples directly over both polyimide depressions and polyimide openings.

Referring now to FIG. 5, the figure shows the result of additional process steps added to FIG. 4.

Power metal 40 is formed over intermediate polyimide layer 30. Power metal 40 is, but not limited to, gold, copper, silver, Cu/Ni/Pd, Cu/Ni/Au, or Ni/Au on seed metal of either TiW, TiWN, NiCr. Power metal thickness is 9 microns, but thickness range typically is 1 to 25 microns. However, thicknesses beyond the typical range could be ascertained by one skilled in the art. The power metal process is electroplated metal. Alternatively, the process is, but is not limited to deposition by evaporation. Additional details for power metal applications are found in "Power Gold for 175C Tj-max" by James Wang and Bob Baird, Proceedings Pan Pacific Microelectronics Symposium, Feb. 18-20, 2003, pp. 241-246.

Small dimples 44 and 46 are formed on the surface of power metal layer 40. Small dimples 44 correspond to depressions 34 in polyimide 30, and small dimples 46 correspond to depressions 36 in the polyimide. Large opening dimples 42 form above polyimide openings 32. The small and large dimples on the surface of power metal layer 40 are visible under optical microscopy. Hundreds of large opening dimples 42 are present on an integrated circuit, IC, to form electrical contacts. Contacts are rectangular and square shapes when viewed on surface of power metal. Dimples form unique shapes such as circle to be shown in more details below. The dimple patterns are easily recognizable by automated system and human inspectors.

Figure 6:
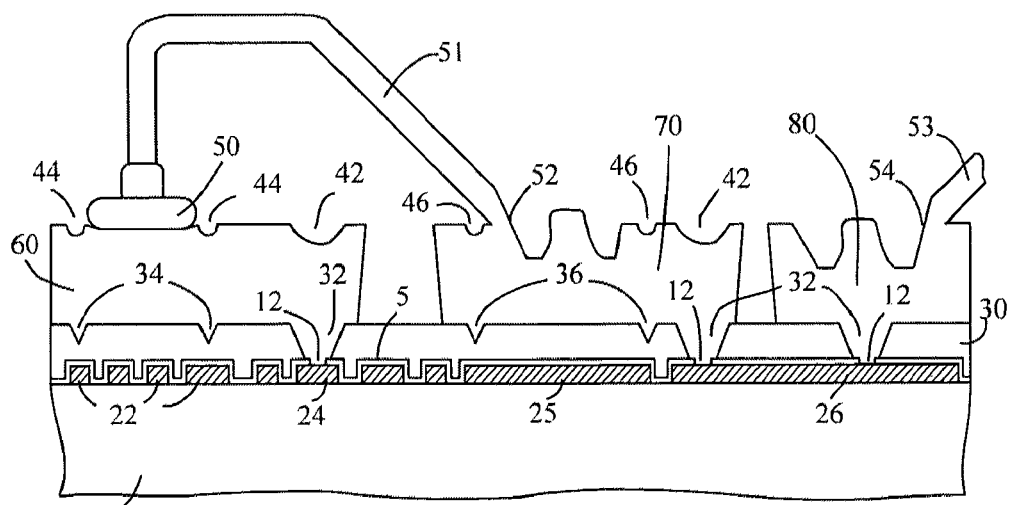
FIG. 6 illustrates cross-section of the semiconductor wafer of FIG. 5 with a primary ball bond plus two secondary wedge bonds aligned to dimple patterns.

Looking to FIG. 6, additional process steps are added to those of FIG. 4 and FIG. 5. For clarity of explanation, power metal 40 is relabeled as power metal segment 60, corresponding to the power metal pad of FIG. 7; power metal segment 70, corresponding to the power metal pad of FIG. 8; and power metal segment 80, corresponding to the power metal pads of FIG. 9.

FIG. 6 shows a cross-section of various wire bonds onto the surface of power metal 40. The width of square dimple 44, also referring to FIG. 7, is designed just slightly wider than the diameter of ball 50.

Alternative circular dimple 48, also referring to FIG. 8, on power metal layer 40 is better suited to judge both the X-Y positional alignment plus diameter of ball bond 50. Shift in the ball bond 50 placement relative to circular dimple 48 is visible under microscopic inspection. If the ball bond 50 overlaps the circular dimple 48 to one side, this signifies misalignment. An inspector, seeing both directions of misalignment, is able to estimate the magnitude of misalignment and visually determine if the process is within specification. After recognizing an alignment problem, the inspector makes an adjustment in order to improve process and product quality. If the ball bond 50 completely covers circular dimple 48, the final bond diameter is too large. The operator then adjusts bond force, ultrasonic power, and duration parameters to achieve optimum bond diameter. It is especially important to maintain consistent wire bonding over active circuits without damaging fragile devices underneath.

In FIG. 6, secondary wedge bond 52 is formed onto power metal 40 directly over active devices. Secondary bonds deeply deform the power metal and are more stressful than primary ball bonds. Secondary wire 51 is severed at wedge bond 52. Power metal pad 70, referring to FIG. 6 and to FIG. 8, has rectangular dimple 46 to pinpoint location of wedge bonding to be away from opening dimple 42.

Wire loops 51 and 53 are, but are not limited to, gold, copper, or aluminum alloy. Copper is harder and cheaper than gold. Copper ball bonding and copper wedge bonding impact greater mechanical damage than gold. Power metal pads provide better protection against mechanical damage from copper wire bonds. Nevertheless, excessive impact force from stress of large diameter copper and gold wires require fragile devices in substrate 1 to be relocated away from immediately beneath maximum bond stress points. Extreme bonding stresses increase importance to accurately bond both primary and secondary bonds onto the surface of ICs and to avoid accidentally swapping primary and secondary bonding sites. Distinguishable power metal pad patterns described further below allow designers to form visual marks and different bond pad patterns to facilitate high stress bonding, complex wire bonds and then afterwards for inspectors to quickly check for bonding problems.

Referring to FIG. 7 a top view of power metal bond pad segment 60 is shown having an electrical contact at opening dimple 42 and two ball bond sites square dimple 44 and segmented dimples 45. Cross-sectioning through bond site 44 and contact 42 is represented by the left power metal segment 60 of FIG. 6. Two possible dimple designs outlining the perimeter of bond sites are shown. A narrow polyimide depression line creates a square dimple 44, and a series of dimples separated by spaces create a dash appearing pattern of segmented dimples 45. A smaller oval dimple 47 designates probe location plus probe needle scrub orientation on the surface of power metal pad 60. The application is not limited to the shapes drawn. Other dimple polygon shapes, pictures, numbers and letters are possible by combining line and segmented dimples.

Referring to FIG. 8 the top view of power metal bond pad segment 70 is shown having electrical contact at opening dimple 42 and ball bond site at circular dimple 48 and bond site at rectangular dimple 46. Probe location is without a dimple mark; thereby, allowing flexibility to probe at any locations on power metal pad 70 outside of bond sites 46 and 48. Cross-section through electrical contact at opening dimple 42 and rectangular dimple 46 is represented by the middle power metal segment 70 of FIG. 6. There is room to create more electrical contacts onto pad segment 70. One or more electrical contacts on the same pad segment are possible (not shown). Not drawn is secondary wedge bonding onto power metal pad. If secondary wedge bonding were performed, then the cross-section view is represented by the middle power metal segment 70 of FIG. 6.

Referring to FIG. 9 the top view of power metal pad segment 80, of FIG. 6 is shown. Power metal pad 80 bridges or shorts three secondary wedge wires on one large power metal pad. Instead of perimeter circular dimples which increase the size of the three pads, electrical contact opening dimple 42, midsize dimple 41 and small dimple 49 are at center of each octagonal pad. The cross-sectional view of dimple 42 is shown in FIG. 5 and FIG. 6. Dimples at the center of each secondary wedge bonds will allow one to precisely position each wedge bond. The location to probe is within oval dimple 84 combined between three pads. After wedge bonding, the edges of octagon are used to visually determine post bond alignment of each wedge bond. Perimeter dimples 82 outline edges of individual octagonal pads that are merged. Power metal pad 80 is the result from dense layout of three parallel bond pads plus one probe site.

Complex pad shapes and multi-wires further demonstrate the benefit of having dimple markings to delineate visible patterns on an otherwise planar power metal pad.

Different sized center dimples as drawn on FIG. 9 are shown for illustration. One skilled in the art would recognize that the dimples may be sized to purposely create practical and visual effects. FIG. 9 visually shows the effect of reducing width and length of polyimide depressions. To form electrical contact opening dimple 42 requires larger polyimide opening dimensions and therefore creates large center dimple as shown on left octagon of FIG. 9. When electrical contact is not required, one defines the midsized polyimide depression without corresponding in-line passivation opening 12, not drawn. Midsized polyimide depression creates midsize dimple 41. Design of center dimple is smaller than the wire diameter. Not drawn on FIG. 9 is secondary wedge bonding onto power metal pads. If with secondary wedge bonds, the cross-sectional view is represented by the right power metal segment 80 of FIG. 6 with either a polyimide opening or polyimide depression at the center of secondary bonds.

Smaller wires require a small dimple 49. Cross-section of small dimple patterns reveals depressions resulting from partial polyimide development. Note that small dimple 49 is smaller in size than the wire diameter of the corresponding bond. Small dimple 49 is harder to see on rough power metal surface. Depending upon properties of polyimide and power metal, there is size below which polyimide depressions are so slight that faint dimples in power metal are no longer visible. From wire diameter, one designs the size of octagon pads of proper dimensions to monitor wire bond alignment plus layout dimple at bond pad center to be smaller than wire diameter and to be visible.

Thus it can now be appreciated that the present invention provides a method for identifying specific metal contact areas on a circuit wafer by utilizing the photo-lithographic limitation of an intermediate wafer layer.

It can be further appreciated that the present invention provides a method of creating visual surface locator dimples from depressions in the intermediate wafer layer.

It can be even further appreciated that the visual dimple locators are efficient in utilizing existing wafer layers to create the locators.

It can be even more so appreciated that the present invention is cost effective in eliminating the need for additional photomasking and wafer process steps.

It can be still further appreciated that the present invention more easily facilitates wire bonding and probing of circuit wafers over active areas.

It can also be appreciated that the present invention provides a method of bonding over active areas by utilizing a dimple locator that is smaller than the corresponding wire bond diameter.

In the foregoing specification, the invention has been described with reference to specific embodiments and to specific polyimide material having characterized feature resolution capability. If the film material changes or the film thickness changes, then the minimum size of electrical contacts and width of dimples also change. The dimples provide visual features for the alignment of probes, placement of wire bonds and for alignment of additional polyimide and subsequent layers on top of the power metal.

While specific embodiments of the present invention have been shown and described, further modifications and improvements will occur to those skilled in the art. It is understood that the invention is not limited to the particular forms shown, and it is intended for the appended claims to cover all modifications that do not depart from the spirit and the scope of this invention.

I claim:

1. A method for providing visual locators for a semiconductor wafer comprising the steps of:
   a. providing a semiconductor substrate having a first surface, said substrate configured for fabricating integrated components;
   b. forming a metal patterned layer above said substrate, said metal patterned layer providing a plurality of interconnects for said integrated components;
   c. forming metal pads for coupling to a portion of said metal interconnects;
   d. forming a passivation layer above said metal patterned layer and said substrate;
   e. covering said passivation layer with an intermediate layer;
   f. patterning a plurality of first contacts and a plurality of second contacts above said intermediate layer, wherein said plurality of second contacts are dimensionally smaller than the any one of said plurality of first contacts, said contacts forming a contact area;
   g. etching said plurality of first and second contacts such that said plurality of first contacts etches through said intermediate layer and said second plurality of second contacts partially etches said intermediate layer; and
   h. forming a thick metal patterned layer above said contact area for providing interconnect to at least a portion of said plurality of first contacts and for providing a dimple pattern for said visual locators.

2. The method as recited in claim 1 wherein said integrated components are passive components.

3. The method as recited in claim 1 wherein said plurality of first contacts and said plurality of second contacts are patterned in separate masking steps.

4. The method as recited in claim 1 wherein said intermediate layer is polyimide.

5. The method as recited in claim 1 wherein said thick metal patterned layer is gold.

6. The method as recited in claim 1 wherein said visual locators are formed in a predefined pattern.

7. The method as recited in claim 1 further comprising the step of dicing said semiconductor wafer.

8. A method for providing visual locators for an electronic assembly comprising the steps of:
   a. providing a substrate having a first surface, said substrate configured for attaching components to said first surface;
   b. forming a metal patterned layer on said substrate, said metal patterned layer providing a plurality of interconnects for said components;
   c. forming metal pads for coupling to a portion of said metal interconnects;
   d. covering said substrate and said metal patterned layer with an intermediate layer;
   e. patterning a plurality of first contacts and a plurality of second contacts above said intermediate layer, wherein said plurality of second contacts are dimensionally smaller than the any one of said plurality of first contacts, said contacts forming a contact area;
   f. etching said plurality of first and second contacts such that said plurality of first contacts etches through said intermediate layer and said second plurality of second contacts partially etches said intermediate layer; and
   g. forming a thick metal patterned layer above said contact area for providing interconnect to at least a portion of said plurality of first contacts and for providing a dimple pattern for said visual locators.

9. The method as recited in claim 8 wherein said substrate is ceramic.

10. The method as recited in claim 8 wherein said components are passive components.

11. The method as recited in claim 8 wherein said substrate is a printed circuit board.

12. The method as recited in claim 8 wherein said plurality of first contacts and said plurality of second contacts are patterned in separate masking steps.

13. The method as recited in claim 8 wherein said intermediate layer is a polymer.

14. The method as recited in claim 8 wherein said thick metal patterned layer is gold.

15. The method as recited in claim 8 wherein said visual locators are formed in a predefined pattern.

16. The method as recited in claim 8 further comprising the step of separating said substrate into individual assemblies.

17. A method for providing visual locators to accommodate bonding over an active area in a semiconductor wafer comprising the steps of:
   a. providing a semiconductor substrate having a first surface, said substrate configured for fabricating integrated components;
   b. forming a metal patterned layer above said substrate, said metal patterned layer providing a plurality of interconnects for said integrated components;
   c. forming a plurality of metal pads,
      i. forming first one of said plurality of metal pads for coupling to a portion of said metal interconnects;
      ii. forming a second one of said plurality of metal pads for receiving a bond wire
   d. forming a passivation layer above said metal patterned layer and said substrate;
   e. covering said passivation layer with an intermediate layer;
   f. forming a visual locator within boundaries of said second one of said metal pads by partially etching a corresponding area of said intermediate layer;
      i. said visual locator providing a target for said bond wire and having a dimension smaller than said bond wire.

* * * * *